United States Patent [19]

Sills

[11] Patent Number: 5,056,137

[45] Date of Patent: Oct. 8, 1991

[54] METHOD AND APPARATUS FOR ENCODING AND DECODING SIGNALS

[76] Inventor: Richard R. Sills, 1085 Park Ave., New York, N.Y. 10128

[21] Appl. No.: 413,417

[22] Filed: Sep. 27, 1989

[51] Int. Cl.$^5$ .......................... H04K 1/02; H03H 9/00; H03M 1/00

[52] U.S. Cl. .......................................... 380/9; 333/147; 333/154; 333/188; 341/50; 341/110; 375/45; 380/25; 380/53

[58] Field of Search .................... 380/9, 25, 43, 44, 38, 380/53, 54; 333/187, 188, 147, 148, 154; 375/5, 45; 341/50, 61, 72, 110, 137, 108; 342/189

[56] References Cited

U.S. PATENT DOCUMENTS

| | | | |
|---|---|---|---|
| 4,209,759 | 6/1980 | Volluet | 333/154 |
| 4,281,299 | 7/1981 | Newbold | 333/187 |
| 4,323,729 | 4/1982 | Westermayer | 380/9 |
| 4,465,986 | 8/1984 | Loh et al. | 333/149 |

*Primary Examiner*—Stephen C. Buczinski

[57] ABSTRACT

In a method and apparatus for encoding signals, signals are passed through a body of a material that modifies a characteristic of signals passing therethrough, such as an acousto-electromagnetic. Energy is applied to the body for establishing a standing wave therein, so that the standing wave controls the passage of signals through said body. The energy may be applied by a piezoelectric element. The body or the piezoelectric element may be removable, to form an encoding key.

18 Claims, 2 Drawing Sheets

METHOD AND APPARATUS FOR ENCODING AND DECODING SIGNALS

This invention is directed to a method and apparatus for encoding and decoding signals, and is more in particular directed to the intentional distortion of signals in a manner that inhibits the unauthorized production of data and control signals.

BACKGROUND OF THE INVENTION

In digital communication systems, wherein, for example, data processing stations are connected to generally accessible communication lines via modems, arrangements are known for inhibiting access to a given data processing station in order to prevent unauthorized reception of data, or unauthorized modification of data in a given station. Such arrangements generally comprise the encoding and decoding of the data signals with various algorithms. While such arrangements provide a degree of data and system security, the codes that are employed have been frequently broken, resulting in loss of valuable information and/or destruction of processing ability of the data station.

SUMMARY OF THE INVENTION

The invention is therefore directed to an improved method and apparatus for inhibiting unauthorized access to a data processing system, that does not rely upon generally reproducible algorithms for the coding and decoding of data signals.

Briefly stated, in accordance with one aspect thereof, the invention is directed to an electronic lock, adapted to be connected for example in series between a computer and a modem, to effect scrambling of the serial signals output from the computer to the modem, and to effect descrambling of the serial signals passing from the modem to the computer. The computer lock in accordance with the invention is provided with a key in order to enable transmission between a pair of two computers. The computer lock distorts signals passing therethrough in at least one direction.

In accordance with the invention, an apparatus is provided for encoding signals, comprising a body of a material that non-reciprocally modifies a characteristic of signals passing therethrough means for applying signals to and receiving signals from the body, and means for controlling the characteristics of the body. In one embodiment of the invention, the material may be an acousto-electromagnetic material, such as yttrium-iron garnet.

In accordance with one structural embodiment of the invention, the body of a material that modifies a characteristic of signals passing therethrough is removable from the apparatus to define a key. The means for applying energy to the body establishes a standing wave therein, whereby the standing wave controls the passage of signals through the body.

In alternative embodiments, the means for applying energy to the body may be removable from the apparatus, to comprise a key, or the key may comprise means for modifying the energy applied to the body. The means for applying energy to the body may comprise a piezoelectric element for applying acoustic energy to the body.

The invention further provides a method for encoding signals, comprising passing electromagnetic waves through a body of a material that non-reciprocally modifies a characteristic of signals passing therethrough, and modifying the characteristics of the body.

In a preferred method, input digital data signals are converted to input analog signals, and the input analog signals are applied to a body of a material that has a characteristic that non-reciprocally modifies electromagnetic signals passing therethrough, such as an acousto-electromagnetic material. Output analog signals from the body are converted to form digital output signals.

BRIEF DESCRIPTION OF THE DRAWING

In order that the invention may be more clearly understood, it will now be disclosed in greater detail with reference to the accompanying drawing, wherein.

DETAILED DISCLOSURE OF THE INVENTION

Figure 1:
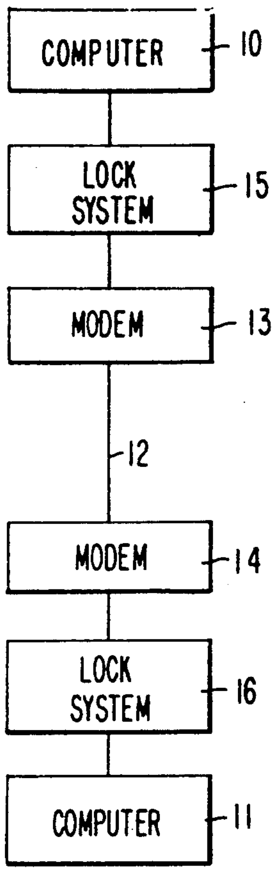
FIG. 1 is a block diagram of a system in accordance with the invention.

Referring now to the drawings, and more in particular to FIG. 1, therein is illustrated a system including a pair of data processing stations, such as microcomputers 10,11 connected to a communication path 12 via separate modems 13,14. Each microcomputer is connected to its respective modem via a separate lock system 15,16. In this example, the microcomputers and modems may be conventional, and the communication path 12 may be a conventional telephone line that is accessible to other persons.

In accordance with the invention, the lock systems 15,16 are comprised of devices wherein the data signals pass through a medium that affects a distortion of the signals, the distortion being controlled by a "key" that the user may insert in the lock system. The signals that pass through the medium may be electrical, electromagnetic (including light signals), or acoustic, depending upon the selection of the material of the medium.

In accordance with the preferred embodiment of the invention, the medium is an acousto-electromagnetic device, such as for example yttrium-iron garnet (YIG). This material has a characteristic whereby the application of acoustic waves thereto results in the establishing of a standing wave pattern of pressure nodes, the pressure nodes producing an effective grating that affects the passage of electromagnetic signals therethrough. Thus, the grating controls the diffraction of the signals as a function of frequency and time. As a consequence, the transfer function of electromagnetic signals applied to the material is a function of a number of factors such as the composition of the material and its shape.

In the look system of the invention, the key may comprise any one of several elements of the lock. Thus, the key may comprise the material through which the signals must pass, or it may directly or indirectly control the acoustic wave applied to the material.

Figure 2:
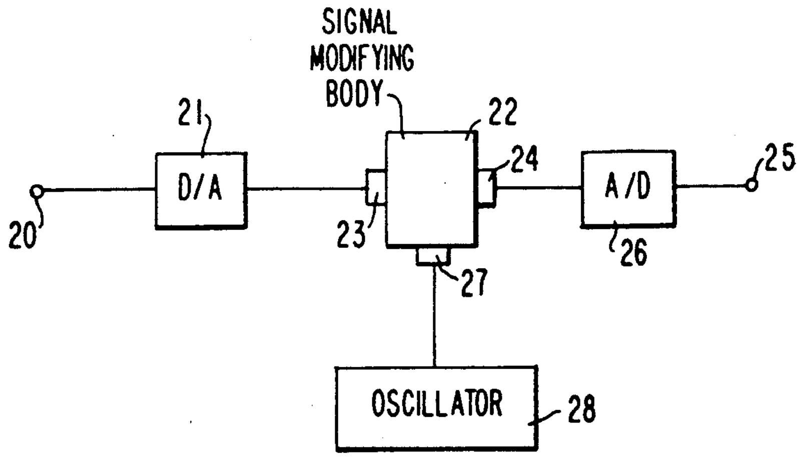
FIG. 2 is a circuit diagram of one embodiment of a lock system for the arrangement of FIG. 1.

FIG. 2 illustrates a first embodiment of the invention, wherein digital data signals applied to an input terminal 20 are directed to a digital to analog converter 21, the analog output signals being applied to a body 22 of an acousto-electromagnetic material via a transducer 23. Analog output signals from the body 22 are received by the transducer 24 and converted to digital form for application to an output terminal 25 by the analog to digital converter 26. An acoustic wave is applied to the body 22 by an acoustic transducer 27 excited by an oscillator 28, or, alternatively, by a piezoelectric element.

In this embodiment of the invention, the body 22 of acousto-electromagnetic material forms the key of the lock, and is hence preferably adapted to be readily removable from the system. For example, the transducers 23,24 and transducer 27 or piezoelectric element may define a holder for releasably holding the body while maintaining contact therewith. The composition of the body 22, and/or its shape, are arranged to enable the setting up of a unique acoustic standing wave pattern therein in response to the energization thereof by the oscillator or the piezoelectric element. Consequently, the body serves as a filter having a complex frequency response, for signals applied thereto. The body thereby "distorts" the signals, so that the frequency components of the output signals differ from those of the input analog signals. As a consequence, the digital output signals at terminal 25 differ from the input digital signals in a manner dependent, for example, upon the frequency components of the analog signals that have been produced by the digital to analog converter 21. The modification of the output digital signals by the system of FIG. 2 is hence not the equivalent of conventional modification of digital signals themselves by an algorithm.

Figure 3:
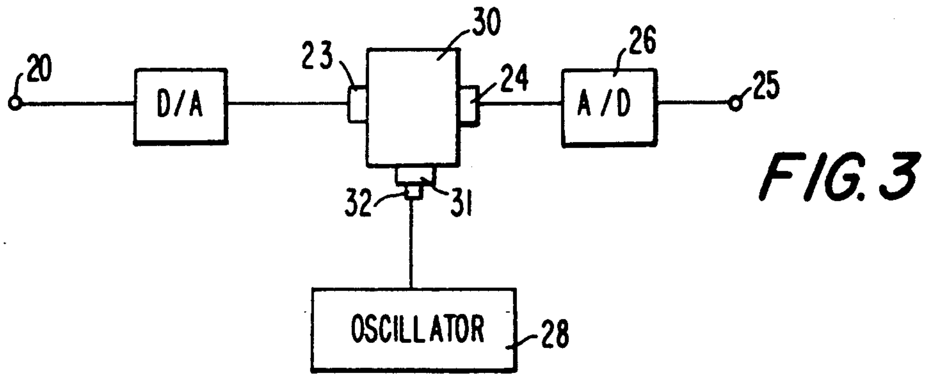
FIG. 3 is a circuit diagram of another embodiment of a lock system for the arrangement of FIG. 1.

FIG. 3 illustrates a further embodiment of the invention, wherein the analog signals from the analog to digital converter are applied to the acousto-electromagnetic body 30 via the transducer 23, and are received therefrom via the transducer 24. In this arrangement, the acousto-electromagnetic body 30 is relatively fixed in the system. The key for controlling the standing wave pattern in this arrangement is the transducer 31 or piezoelectric element, which is shaped to uniquely apply pressure to the body 30. For example, the transducer 31 or piezoelectric element may contact the acousto-electromagnetic body 30 at specific positions thereof, to thereby control the establishing of a unique standing wave in the body. In this case, the transducer 31 or piezoelectric element is removable from the system by the operator. Energization is applied to the piezoelectric element 31 by the oscillation source 28, for example by a contact 32 that may form a part of a holder for the removable element 31.

Figure 4:
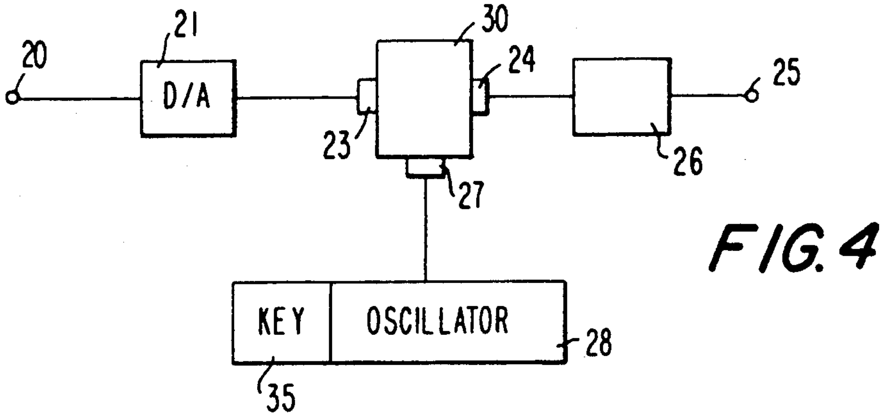
FIG. 4 is a circuit diagram of still another embodiment of a lock system for the arrangement of FIG. 1.

In a further embodiment of the invention, as illustrated in FIG. 4, the body 30 of acousto-electromagnetic material is fixed in the system, as is the piezoelectric element 31. In this case, the frequency or frequencies and/or amplitude of oscillation of oscillator 28 are controlled by a "key" 35. The key for controlling one or more of these characteristics of the oscillator, to produce a unique standing wave acoustic pattern in the acousto-electromagnetic body 30, may comprise one or more removable passive circuit elements for the oscillator, such as a frequency determining crystal or other element of the circuit.

Figure 5:
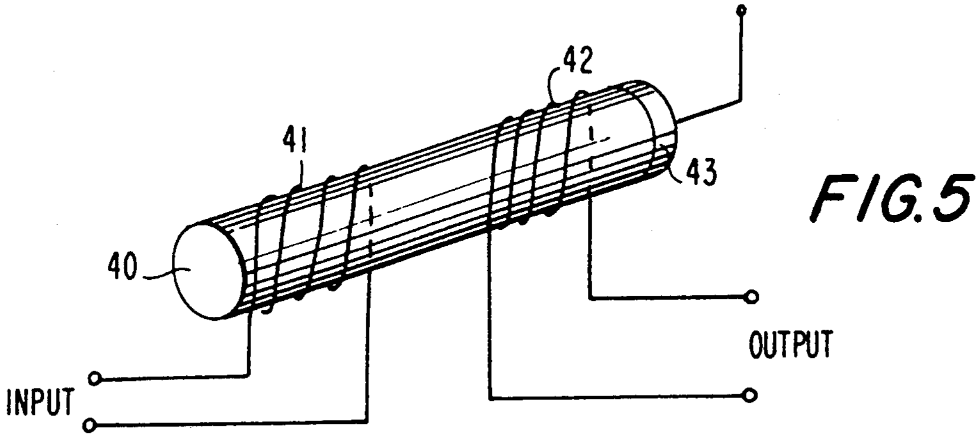
FIG. 5 is an illustration of an acousto-electromagnetic arrangement that may be employed in the circuits of FIGS. 2–4.

One embodiment of the lock assembly itself is illustrated in FIG. 5, wherein the acousto-electromagnetic body 40 is cylindrical. The analog signals are applied to the body via a coil 41, and signals modified in the body are received by a coil 42. The piezoelectric element 43 for exciting an acoustic standing wave in the acousto-electromagnetic body 40 may be affixed to one end of the body 40. As in the arrangement of FIG. 2, the acousto-electromagnetic body 40 may be removable from the coils, to form a key for the system. Alternatively, the piezoelectric element 43 may be replaceable, as in the arrangement of FIG. 3, or the acoustic standing wave may be controlled in the manner illustrated in FIG. 4.

Figure 6:
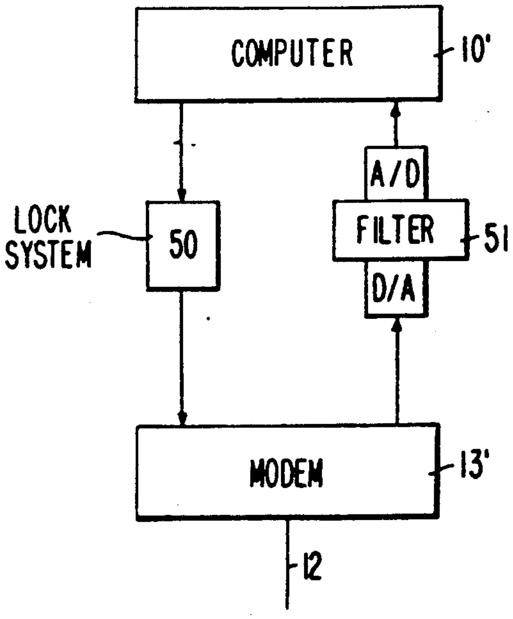
FIG. 6 is a block diagram of a modification of the system of the invention.

Since the embodiments of the lock system described above are not reciprocal, the passage of signals in one direction may require the use of a device of a different type. Thus, while theoretically a device of the type above described could be designed to have a transfer function that is the reciprocal of another device, the acoustical patterns are sufficiently complex that the design of such a device is very difficult. Accordingly, when non-reciprocal devices are employed in accordance with the invention, a filter may be readily provided to have the reciprocal transfer function. As illustrated in FIG. 6, the acousto-electromagnetic element lock 50 as described above may be connected for signal passage in only one direction between the microcomputer and modem, with a filter system 51 being provided for signal passage in the opposite direction. The filter system may include digital to analog and analog to digital conversion devices, if desired.

In a system in accordance with the invention, each of a pair of microcomputers as illustrated in FIG. 1 may have an identical acousto-electromagnetic lock of the type described above, and each of the systems may also have an identical filter arrangement as illustrated in FIG. 6. With such an arrangement, the possibility of obtaining unauthorized access to either of the microcomputer systems is minimized in a simple and efficient manner. For example, the acousto-electromagnetic body itself may constitute a small chip of material.

It is of course apparent that common numbers in the figures of the drawings refer to the same or equivalent elements.

While the invention has been disclosed and described with reference to a single embodiment, it will be apparent that variations and modification may be made therein, and it is therefore intended in the following claims to cover each such variation and modification as falls within the true spirit and scope of the invention.

What is claimed is:

1. An apparatus for encoding digital signals, comprising a body of a material that has a transfer function and modifies a characteristic of signals passing therethrough, digital to analog converting means connected to receive said digital signals, means for applying the output of said converting means to said body, means for receiving signals from said body, means for converting said signals received from said body to output digital signals, and means for controlling the transfer function of said body.

2. The apparatus of claim 1 wherein said material is an acousto-electromagnetic material.

3. The apparatus of claim 2 wherein said acousto-electromagnetic material is yttrium-iron garnet.

4. An apparatus for encoding digital signals, comprising a body of a material that modifies a characteristic of signals passing therethrough, said body being removable from said apparatus, digital to analog converting means connected to receive said digital signals, means for applying the output of said converting means to said body, means for receiving signals from said body, means for converting said signals received from said body to output digital signals, and means for applying energy to said body for establishing a standing wave therein, whereby said standing wave controls the passage of signals through said body.

5. The apparatus of claim 4 wherein said material is an acousto-electromagnetic material, and said means for applying energy comprises a piezoelectric element for applying acoustic energy to said body.

6. An apparatus for encoding digital signals, comprising a body of material that modifies a characteristic of signals passing therethrough, digital to analog converting means coupled to receive said digital signals, means applying the output of said converting means to said body, means for receiving signals from said body, means for converting said signals received from said body to form digital output signals, and means for applying energy to said body for establishing a standing wave therein, said means for applying energy being removable from said apparatus, whereby said standing wave controls the passage of signals through said body.

7. The apparatus of claim 6 wherein said material is an acousto-electromagnetic material, and said means for applying energy comprises a piezoelectric element for applying acoustic energy to said body.

8. An apparatus for encoding digital signals, comprising a body of material that modifies a characteristic of signals passing therethrough, digital to analog converting means coupled to receive said digital signals, means applying the output of said converting means to said body, means for receiving signals from said body, means for converting signals received from said body to form digital output signals, and means for applying energy to said body for establishing a standing wave therein, whereby said standing wave controls the passage of signals through said body, said means for applying energy comprising a transducer coupled to said body and a source of energy for said transducer, and further comprising means for controlling said source of energy for modifying said standing wave.

9. The apparatus of claim 8 wherein said material is an acousto-electromagnetic material, and said means for applying energy comprises a piezoelectric element for applying acoustic energy to said body.

10. A method for encoding signals, comprising passing electromagnetic waves through a body of an acousto-electromagnetic material and applying acoustic waves thereto to set up a standing wave pattern of pressure nodes in said body, whereby the body has a transfer function that modifies a characteristic of signals passing therethrough, and modifying the transfer function of said body by modifying said acoustic wave.

11. A method for encoding input digital data signals, comprising converting said input digital data signals to input analog signals, applying said input analog signals to a body of a material that has a transfer function and a characteristic that modifies electromagnetic signals passing therethrough, controlling the transfer function of said body, receiving output analog signals from said body, and converting said output analog signals to digital output signals.

12. The method of claim 11 wherein said step of applying input analog signals to a body of material comprises applying said input analog signals to a body of an acousto-electromagnetic material.

13. The method of claim 12 wherein said step of controlling said characteristic comprises applying an acoustic wave to said body.

14. The method of claim 13 wherein said step of applying an acoustic wave comprises applying said acoustic wave to predetermined positions of said body via a piezoelectric element.

15. An apparatus for encoding digital signals, comprising a body of a material, means for controlling said body to have a first transfer function for signals passing therethrough in one direction and a second different transfer function for signals passing therethrough in another different direction, means for converting said digital signals to non-digital signals, means for applying the output of said converting means to said body for modification thereof in accordance with said transfer function, means for receiving signals modified by said transfer function from said body, and means for converting said modified signals to form output digital signals.

16. The apparatus of claim 15 further comprising means for modifying said first transfer function.

17. An apparatus for encoding digital signals, comprising signal modifying means having a transfer function for signals passing therethrough in a given direction, means for converting said digital signals to non-digital signals, means for applying the output of said converting means to said signal modifying means for modification thereof in accordance with said transfer function, means for receiving signals modified by said transfer function from said modifying means, and means for converting said modified signals to form output digital signals.

18. The apparatus of claim 17 further comprising means for modifying said transfer function of said modifying means.

* * * * *

UNITED STATES PATENT AND TRADEMARK OFFICE
CERTIFICATE OF CORRECTION

PATENT NO. : 5,056,137

DATED : October 8, 1991

INVENTOR(S) : Richard R. Sills

It is certified that error appears in the above-identified patent and that said Letters Patent is hereby corrected as shown below:

On the cover page, below "Primary Examiner--Stephen C. Buczinski" insert the following:

--Attorney, Agent or Firm--Jordan and Hamburg--.

Signed and Sealed this

Second Day of March, 1993

*Attest:*

STEPHEN G. KUNIN

*Attesting Officer*

*Acting Commissioner of Patents and Trademarks*